US011277141B1

(12) United States Patent
Sathe et al.

(10) Patent No.: US 11,277,141 B1
(45) Date of Patent: Mar. 15, 2022

(54) DUAL FEEDBACK LOOPS FOR INTEGRATED VOLTAGE AND CLOCK REGULATION

(71) Applicant: UNIVERSITY OF WASHINGTON, Seattle, WA (US)

(72) Inventors: Visvesh S. Sathe, Seattle, WA (US); Xun Sun, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 17/192,403

(22) Filed: Mar. 4, 2021

(51) Int. Cl.
*H03L 7/099* (2006.01)
*G06F 1/08* (2006.01)
*G06F 1/10* (2006.01)

(52) U.S. Cl.
CPC .............. *H03L 7/099* (2013.01); *G06F 1/08* (2013.01); *G06F 1/10* (2013.01)

(58) Field of Classification Search
None
See application file for complete search history.

(56) References Cited

U.S. PATENT DOCUMENTS

| | | | |
|---|---|---|---|
| 6,922,111 B2 | 7/2005 | Kurd et al. | |
| 7,126,433 B2 * | 10/2006 | Godambe | H03L 3/00 331/74 |
| 7,719,369 B2 | 5/2010 | Kamath et al. | |
| 8,710,883 B1 | 4/2014 | Fang et al. | |
| 10,469,090 B1 | 11/2019 | Zheng | |
| 2007/0061090 A1 * | 3/2007 | Luo | G06F 1/26 702/64 |
| 2007/0096783 A1 | 5/2007 | de la Torre | |
| 2008/0303566 A1 | 12/2008 | Shen et al. | |
| 2009/0302951 A1 | 12/2009 | Ballantyne | |
| 2012/0161884 A1 | 6/2012 | Sathe | |
| 2020/0244274 A1 * | 7/2020 | Sathe | G06F 1/08 |

FOREIGN PATENT DOCUMENTS

WO     WO2011/047861 A1     4/2011

OTHER PUBLICATIONS

Bol, D. et al., "Sleepwalker: A 25-MHz 0.4-V Sub-mm2 7-μW/MHz Microcontroller in 65-nm LP/GP CMOS for Low-Carbon Wireless Sensor Nodes," IEEE Journal of Solid-State Circuits, vol. 48, No. 1, Jan. 2013, pp. 20-32.

(Continued)

*Primary Examiner* — Cassandra F Cox
(74) *Attorney, Agent, or Firm* — McDonnell Boehnen Hulbert & Berghoff LLP

(57) ABSTRACT

A control circuit includes an oscillator configured to provide, to a digital load, a clock signal having an oscillation period that (i) depends on a supply voltage and (ii) is greater than a critical path delay of the digital load. The control circuit also includes a control module configured to provide the supply voltage to the digital load and the oscillator and adjust the supply voltage based on (i) a degree of a voltage difference between the supply voltage and a reference voltage and (ii) a degree of a phase difference between the clock signal and a reference clock such that the oscillator changes the oscillation period to reduce the degree of the phase difference between the clock signal and the reference clock.

20 Claims, 3 Drawing Sheets

(56) References Cited

OTHER PUBLICATIONS

Bowman, K. A. et al., "A 16 nm All-Digital Auto-Calibrating Adaptive Clock Distribution for Supply Voltage Droop Tolerance Across a Wide Operating Range," IEEE Journal of Solid-State Circuits, vol. 51, No. 1, Jan. 2016, pp. 8-17.
Gangopadhyay, S. et al., "UVFR: A Unified Voltage and Frequency Regulator with 500MHz/0.84V to 100KHz/0.27V Operating Range, 99.4% Current Efficiency and 27% Supply Guardband Reduction," ESSCIRC Conference 2016: 42nd European Solid-State Circuits Conference, 2016, pp. 321-324.
Rahman, F. U. et al., "A Unified Clock and Switched-Capacitor-Based Power Delivery Architecture for Variation Tolerance in Low-Voltage SoC Domains," IEEE Journal of Solid-State Circuits, vol. 54, No. 4, Apr. 2019, pp. 1173-1184.
Rahman, F. U. et al., "An All-Digital Unified Clock Frequency and Switched-Capacitor Voltage Regulator for Variation Tolerance in a Sub-Threshold ARM Cortex M0 Processor," 2018 IEEE Symposium on VLSI Circuits, 2018, pp. 65-66.
Sun, X. et al., "A Combined All-Digital PLL-Buck Slack Regulation System with Autonomous CCM/DCM Transition Control and 82% Average Voltage-Margin Reduction in a 0.6-to-1.0V Cortex-M0 Processor," 2018 IEEE International Solid—State Circuits Conference— (ISSCC), 2018, pp. 302-304.
Sun, X. et al., "An All-Digital Fused PLL-Buck Architecture for 82% Average Vdd-Margin Reduction in a 0.6-to-1.0-V Cortex-M0 Processor," IEEE Journal of Solid-State Circuits, vol. 54, No. 11, Nov. 2019, pp. 3215-3225.
Sun, X. et al., "UniCaP-2: Phase-Locked Adaptive Clocking with Rapid Clock Cycle Recovery in 65nm CMOS," IEEE 2020 IEEE Symposium on VLSI Circuits—Honolulu, HI, USA (Jun. 16, 2020-Jun. 19, 2020), 2 pages.
Gangopadhyay, S. et al., "UVFR: A Unified Voltage and Frequency Regulator with 500MHz/0.84V to 100KHz/0.27V Operaling Range, 99.4% Current Efficiency and 27% Supply Guardband Reduction", ESSCIRC, pp. 321-324, 2016.
Huang, C. et al., "An 82.4% Efficiency Package-Bondwire-Based Four-Phase Fully Integrated Buck Converter with Flying Capacitor for Area Reduction," ISSCC, pp. 362-363, 2013.
Kar, M. et al., "An All-Digital Fully Integrated Inductive Buck Regulator with a 250-MHz Multi-Sampled Compensator and a Lightweight Auto-Tuner in 130-nm CMOS," IEEE JSSC, vol. 52, No. 7, pp. 1825-1835, 2017.
Krishnamurthy, H. K. et al., "A Digitally Controlled Fully Integrated Voltage Regulator With On-Die Solenoid Inductor with Planar Magnetic Core in 14 nm tri-gate CMOS," ISSCC, pp. 336-337, 2017.
Kurd, N. et al., "Next Generation Intel Core Micro-Architecture (Nehalem) Clocking," IEEE JSSC, vol. 44, No. 4, pp. 1121-1129, 2009.
Rahman, F. et al., "An All-Digital Unified Clock Frequency and Switched-Capacitor Voltage Regulator for Variation Tolerance in a Sub-Threshold ARM Cortex M0 Processor," 2018 IEEE Symposium on VLSI Circuits, 2 pages.
Sun, X. et al., "A Combined All-Digital PLL-Buck Slack Regulation System with Autonomous CCM/DCM Transition Control and 82% Average Voltage-Margin Reduction in a 0.6-to-1.0V Cortex-M0 Processor," 2018 IEEE International Solid-State Circuits Conference, Feb. 11-15, 2018, San Francisco, CA, 3 pages.
Sun, X. et al., "A Combined All-digital PLL-Buck Slack Regulation System with Autonomous CCM/DCM Transition Control and 82% Average Voltage-Margin Reduction in a 0.6-lo-1.0V Cortex-MO Processor," 2018 IEEE International Solid-State Circuits Conference— (ISSCC), Feb. 11-15, 2018, 52 pages.
Zhang, X. et al., "A 0.6 V Input CCM/DCM Operating Digital Buck Converter in 40 nm CMOS," IEEE JSSC, vol. 40, No. 11, pp. 2377-2386, Nov. 2014.

\* cited by examiner

PROVIDING, TO A DIGITAL LOAD, A SUPPLY VOLTAGE AND A CLOCK SIGNAL HAVING AN OSCILLATION PERIOD THAT (I) DEPENDS ON THE SUPPLY VOLTAGE AND (II) IS GREATER THAN A CRITICAL PATH DELAY OF THE DIGITAL LOAD

402

ADJUSTING THE SUPPLY VOLTAGE BASED ON (I) A DEGREE OF A VOLTAGE DIFFERENCE BETWEEN THE SUPPLY VOLTAGE AND A REFERENCE VOLTAGE AND (II) A DEGREE OF A PHASE DIFFERENCE BETWEEN THE CLOCK SIGNAL AND A REFERENCE CLOCK SUCH THAT THE OSCILLATION PERIOD IS CHANGED TO REDUCE THE DEGREE OF THE PHASE DIFFERENCE BETWEEN THE CLOCK SIGNAL AND THE REFERENCE CLOCK

DUAL FEEDBACK LOOPS FOR INTEGRATED VOLTAGE AND CLOCK REGULATION

BACKGROUND

Some synchronous digital systems have a first control loop and a second control loop that operate independently. The first control loop can control a supply voltage such that the supply voltage tracks a reference voltage. The supply voltage typically powers a digital load such as a microprocessor. The second control loop controls a clock signal such that a frequency of the clock signal tracks a frequency of a reference clock signal. The clock signal is typically provided to the digital load for timing purposes.

At times, the supply voltage can undesirably drift from the reference voltage. For example, a decreased supply voltage can cause the digital load to require more time to perform a given computation. Meanwhile, the clock signal frequency is typically unaffected by this change in the supply voltage. If the supply voltage decreases enough, timing errors can occur. One way to help prevent such timing errors is to have a built in margin or "guardband" for the supply voltage. However, the built in margin can cause less efficient operation of the digital load.

SUMMARY

A first example includes a control circuit comprising: an oscillator configured to provide, to a digital load, a clock signal having an oscillation period that (i) depends on a supply voltage and (ii) is greater than a critical path delay of the digital load; and a control module configured to: provide the supply voltage to the digital load and the oscillator; and adjust the supply voltage based on (i) a degree of a voltage difference between the supply voltage and a reference voltage and (ii) a degree of a phase difference between the clock signal and a reference clock such that the oscillator changes the oscillation period to reduce the degree of the phase difference between the clock signal and the reference clock.

A second example includes a method comprising: providing, to a digital load, a supply voltage and a clock signal having an oscillation period that (i) depends on the supply voltage and (ii) is greater than a critical path delay of the digital load; and adjusting the supply voltage based on (i) a degree of a voltage difference between the supply voltage and a reference voltage and (ii) a degree of a phase difference between the clock signal and a reference clock such that the oscillation period is changed to reduce the degree of the phase difference between the clock signal and the reference clock.

When the term "substantially" or "about" is used herein, it is meant that the recited characteristic, parameter, or value need not be achieved exactly, but that deviations or variations, including, for example, tolerances, measurement error, measurement accuracy limitations, and other factors known to those of skill in the art may occur in amounts that do not preclude the effect the characteristic was intended to provide. In some examples disclosed herein, "substantially" or "about" means within +/−0-5% of the recited value.

The following publications are hereby incorporated by reference into the present disclosure: (1) Rahman, Fahim & Kim, Sung & John, Naveen & Kumar, Roshan & Li, Xi & Pamula, Venkata Rajesh & A. Bowman, Keith & S. Sathe, Visvesh, "An All-Digital Unified Clock Frequency and Switched-Capacitor Voltage Regulator for Variation Tolerance in a Sub-Threshold ARM Cortex M0 Processor," 2018 IEEE Symposium on VLSI Circuits, DOI: 10.1109NLSIC.2018.8502303, (2) Xun Sun, Sung Kim, Fahim ur Rahman, Venkata Rajesh Pamula, Xi Li, Naveen John, Visvesh S. Sathe, "A combined all-digital PLL-buck slack regulation system with autonomous CCM/DCM transition control and 82% average voltage-margin reduction in a 0.6-to-1.0V cortex-M0 processor," 2018 IEEE International Solid—State Circuits Conference—(ISSCC), DOI: 10.1109/ISSCC.2018.8310304 (3) Samantak Gangopadhyay, Saad B. Nasir, A. Subramanian, Visvesh Sathe, Arijit Raychowdhury, "UVFR: A Unified Voltage and Frequency Regulator with 500 MHz/0.84V to 100 KHz/0.27V operating range, 99.4% current efficiency and 27% supply guardband reduction," ESSCIRC Conference 2016: 42nd European Solid-State Circuits Conference, DOI: 10.1109/ESSCIRC.2016.7598307 and (4) Xun Sun, Akshat Boora, Rajesh Pamula, Chi-Hsiang Huang, Diego Peña-Colaiocco, and Visvesh S. Sathe, "UniCaP-2: Phase-Locked Adaptive Clocking with Rapid Clock Cycle Recovery in 65 nm CMOS, 2020 IEEE Symposium on VLSI Circuits, DOI: 10.1109/VLSICircuits18222.2020.9162982.

The present disclosure also incorporates by reference U.S. application Ser. No. 16/261,161, filed on Jan. 29, 2019.

These, as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate the invention by way of example only and, as such, that numerous variations are possible.

BRIEF DESCRIPTION OF THE DRAWINGS

FIG. 4 is a block diagram of a method, according to an example embodiment.

DETAILED DESCRIPTION

Figure 1:
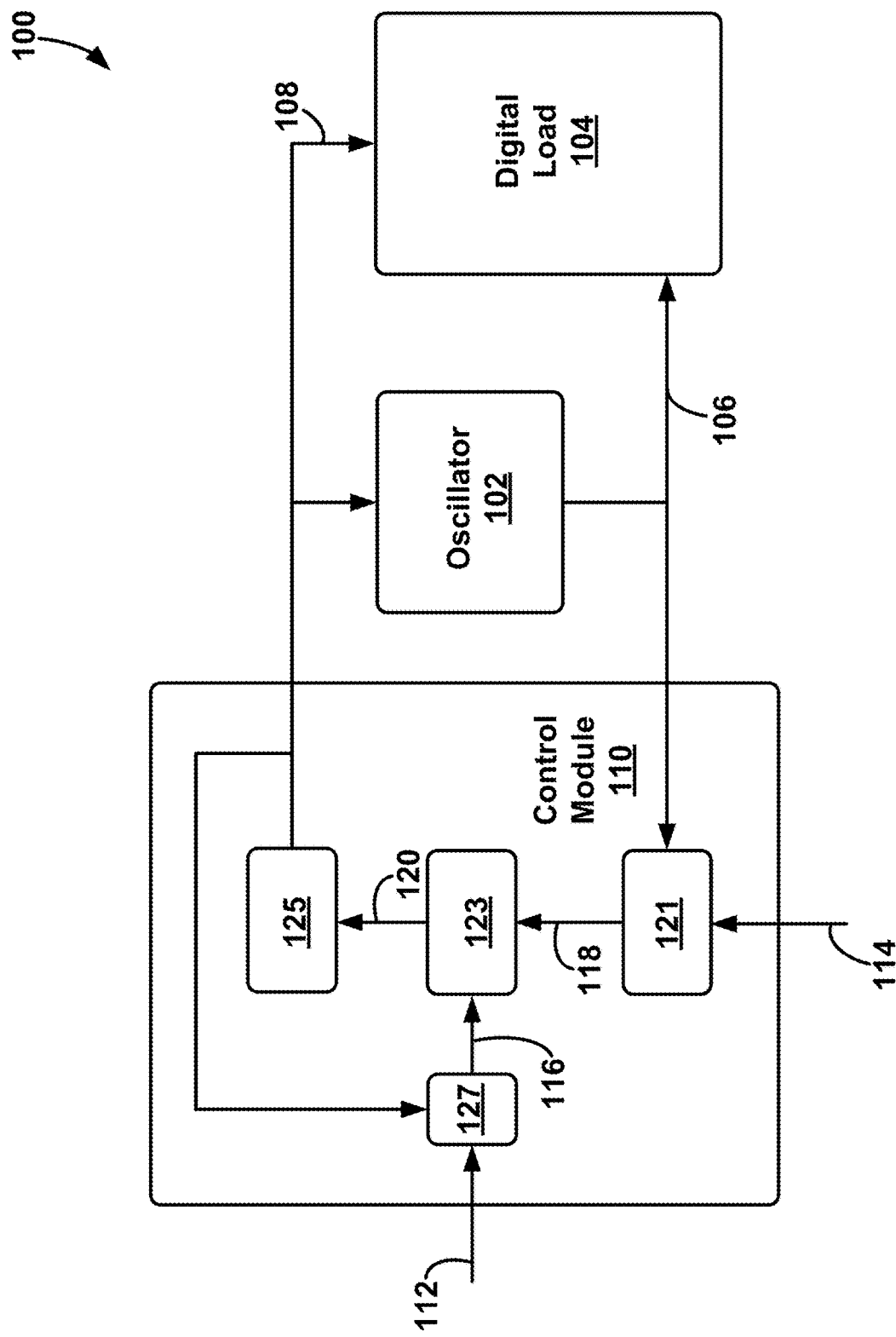
FIG. 1 is a schematic diagram of a control circuit, according to an example embodiment.

As discussed above, improved circuits and methods for regulating a clock signal and a supply voltage are needed. Such circuits and methods are discussed in the present disclosure.

Within examples, a control circuit includes an oscillator configured to provide, to a digital load (e.g., a microprocessor), a clock signal having an oscillation period that (i) depends on a supply voltage and (ii) is greater than a critical path delay of the digital load. The control circuit also includes a control module configured to provide the supply voltage to the digital load and the oscillator and to adjust the supply voltage based on (i) a degree of a voltage difference between the supply voltage and a reference voltage and (ii) a degree of a phase difference between the clock signal and a reference clock, such that the oscillator changes the oscillation period to reduce the degree of the phase difference between the clock signal and the reference clock.

For example, an increase in current drawn by the digital load generally causes the supply voltage to decrease or "droop." The decrease in the supply voltage generally increases the time required for the digital load to perform computations (e.g., for inputs to be propagated through combinational or sequential logic paths of the digital load to be manifested as outputs). That is, the critical path delay of the digital load increases. This decreases the clock frequency (e.g., increases the clock period) at which the digital load could conceivably operate without timing errors. In a corrective action, the oscillator receives the supply voltage and, in response to the decrease in the supply voltage, decreases the oscillation frequency of the clock signal. This can beneficially prevent the increased critical path delay of the digital load from causing timing errors. That is, the oscillator can operate to prevent the clock signal from "getting ahead" of the operations of the digital load. The oscillator can similarly compensate to correct a clock signal in response to a supply voltage that increases or "spikes."

In addition to having a clock signal that inherently "tracks" the non-idealities of the supply voltage, it is beneficial to take action to correct those non-idealities, as well as the resultant non-idealities of the clock signal, rather than to simply adapt to the non-idealities. In a first feedback loop, the control module compares the supply voltage to the reference voltage and (e.g., continuously) adjusts the supply voltage to minimize the voltage difference between the supply voltage and the reference voltage. In a second feedback loop, the control module compares the clock signal to the reference clock and (e.g., continuously) adjusts the supply voltage to minimize the phase difference between the clock signal and the reference clock. The first feedback loop typically operates quickly to correct the supply voltage directly whereas the second feedback loop generally operates more slowly to fine tune the supply voltage to cause the clock signal to catch up with or slow down to match the absolute phase of the reference clock.

As such, the control circuit can account for transient deviations in operating conditions of the digital load as noted above, but after the transient deviations are addressed, the control circuit generally controls the supply voltage to control the oscillation frequency of the clock signal to match a predetermined frequency (e.g., f=2 GHz) during steady state conditions. One potential advantage of the control circuit is that it can control the clock signal to achieve not only frequency lock but true phase lock with the reference signal.

Changes in ambient temperature of the digital load will also affect the operation of the control circuit. For example, increased temperature will generally cause the critical path delay of the digital load to increase. In response, the control circuit will generally decrease the oscillation frequency of the clock signal so that the clock signal does not get ahead of the operation of the digital load and cause timing errors. Decreased temperature will generally cause the critical path delay of the digital load to decrease. In response, the control circuit will generally increase the oscillation frequency of the clock signal.

FIG. 1 is a schematic diagram of a control circuit 100. The control circuit 100 includes an oscillator 102 configured to provide, to a digital load 104, a clock signal 106 having an oscillation period that (i) depends on a supply voltage 108 and (ii) is greater than a critical path delay of the digital load 104. The control circuit 100 also includes a control module 110 configured to provide the supply voltage 108 to the digital load 104 and the oscillator 102. The control module 110 is also configured to adjust the supply voltage 108 based on (i) a degree of a voltage difference between the supply voltage 108 and a reference voltage 112 and (ii) a degree of a phase difference between the clock signal 106 and a reference clock 114 such that the oscillator changes the oscillation period to reduce the degree of the phase difference between the clock signal 106 and the reference clock 114.

The oscillator 102 can take the form of any circuit configured to generate the clock signal 106 (e.g., a square wave) having an oscillation frequency that is dependent on the supply voltage 108. The oscillator 102 can take the form of a voltage controlled oscillator (VCO), for example. The oscillator 102 provides the clock signal 106 to the digital load 104 and to the control module 110. Generally, the oscillation frequency of the clock signal 106 will be (e.g., monotonically) dependent on the supply voltage 108. That is, as the supply voltage 108 increases the oscillation frequency of the clock signal 106 increases, and as the supply voltage 108 decreases the oscillation frequency of the clock signal 106 decreases. As shown in FIG. 1, the oscillator 102 receives the supply voltage 108 as an input and provides the clock signal 106 as an output.

The oscillator 102 is structured such that, for a given supply voltage 108, the oscillation frequency of the clock signal 106 is (e.g., slightly) less than a reciprocal of the critical path delay of the digital load 104. For example, the period of the clock signal 106 could be anywhere from 100.1% to 105% of the critical path delay of the digital load 104. Changes in the supply voltage 108 affect the oscillation frequency of the clock signal 106 and the critical path delay of the digital load 104 in a similar (e.g., proportional) manner. As such, the control circuit 100 inherently avoids timing errors.

The digital load 104 can take the form of a microprocessor, a graphics processing unit (GPU), or any digital circuit or system that includes combinational or sequential synchronous logic circuits. The digital load 104 is connected to receive the supply voltage 108 from the control module 110 and the clock signal 106 from the oscillator 102.

The control module 110 includes a phase comparator 121, a summer module 123, a voltage converter 125, and a voltage comparator 127. The various components of the control module 110 are typically formed at least in part by combinational logic circuits, but other examples are possible.

The phase comparator 121 is configured to receive and compare the reference clock 114 and the clock signal 106. For example, the phase comparator 121 can include a subtractor circuit, a comparator, an operational amplifier, a time-to-digital converter or any other circuit configured to generate a voltage offset signal 118 that indicates the degree of the phase difference (e.g., $\Delta\varphi$) between and the clock signal 106 the reference clock 114.

The voltage comparator 127 is configured to receive and compare the supply voltage 108 and a reference voltage 112. For example, the voltage comparator 127 can include a subtractor circuit, a comparator, an operational amplifier, or any other circuit configured to generate a voltage offset signal 116 that indicates the degree of the voltage difference (e.g., $\Delta V$) between the supply voltage 108 and a reference voltage 112.

The summer module 123 is configured to receive and add the voltage offset signal 116 and the voltage offset signal 118 to generate a sum 120 of the voltage offset signal 116 and the voltage offset signal 118. The summer module 123 can include an operational amplifier-based adder circuit, for example. In some examples, the voltage offset signal 116 or the voltage offset signal 118 are weighted prior to generating the sum 120.

The voltage converter 125 is configured to receive the sum 120 and adjust the supply voltage 108 based on the sum 120. The voltage converter 125 can take the form of a buck converter, a switched capacitor converter, or a linear regulator, among other forms. The voltage converter is powered by an input voltage (not shown) which is typically greater than the supply voltage 108.

In an example in which the supply voltage 108 exhibits a droop below the reference voltage 112 that causes the clock signal 106 to lag the reference clock 114, the control module 110 is configured to increase the supply voltage 108 such that the oscillation period of the clock signal 106 decreases (i.e., the oscillation frequency of the clock signal 106 increases) so that a lag time of the clock signal 106 with respect to the reference clock 114 is reduced. In some examples, the increase in the supply voltage 108 will cause the lag time to be reduced to substantially zero.

In another example, in which the supply voltage 108 exhibits a spike above the reference voltage 112 that causes the clock signal 106 to lead the reference clock 114, the control module 110 is configured to decrease the supply voltage 108 such that the oscillation period of the clock signal 106 increases (i.e., the oscillation frequency of the clock signal 106 decreases) so that a lead time of the clock signal 106 with respect to the reference clock 114 is reduced. In some examples, the decrease in the supply voltage 108 will cause the lead time to be reduced to substantially zero.

Figure 2:
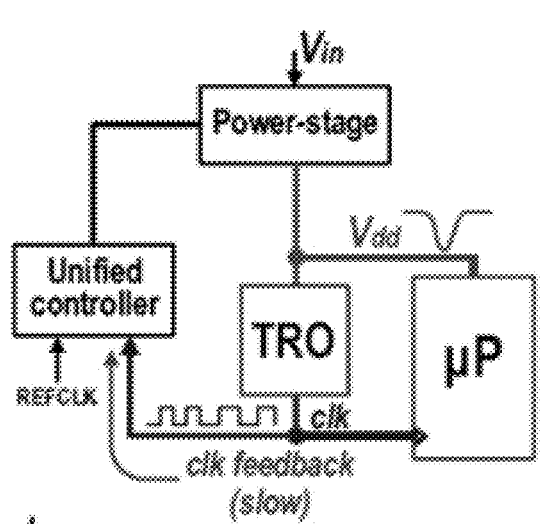
FIG. 2 includes a schematic diagram of a control circuit having a single feedback loop and graphical depictions of the performance of the control circuit, according to an example embodiment.

FIG. 2 includes a schematic diagram of a control circuit having a single clock signal feedback loop. As shown, the control circuit (e.g., the "unified controller") monitors only the clock signal and (e.g., the "power-stage") adjusts $V_{dd}$ accordingly to have the clock signal better track the reference clock. This will generally achieve both frequency lock and phase lock in the steady state between the clock signal and the reference clock, but it can take an undesirable amount of time for this to occur.

As shown, $I_{load}$ exhibits a spike that causes a droop in $V_{dd}$ and in $f_{clk}$. The control circuit reacts by increasing $V_{dd}$ until it reaches a value greater than its steady state target value so that $f_{clk}$ also exceeds its steady state target value, allowing the clock signal to eventually reach phase lock and frequency lock with the reference clock. However, the degree of phase difference $\Delta\varphi$ between the clock signal and the reference clock becomes too great in the meantime and saturation occurs in the digital load.

Figure 3:
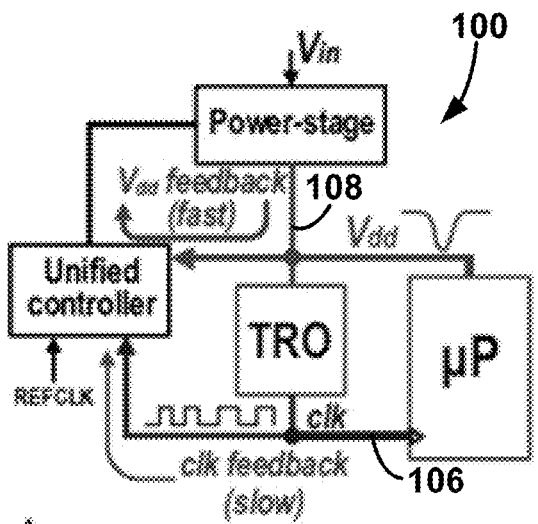
FIG. 3 includes a schematic diagram of a control circuit having dual feedback loops and graphical depictions of the performance of the control circuit, according to an example embodiment.

FIG. 3 includes a schematic diagram of the control circuit 100 having both a clock signal feedback loop and a supply voltage feedback loop. As shown, the control circuit 100 (e.g., the "unified controller") monitors the clock signal 106 and the supply voltage 108, and adjusts the supply voltage 108 accordingly to have the clock signal 106 better track the reference clock and to have the supply voltage 108 better track the reference voltage. This will generally achieve both frequency lock and phase lock in the steady state between the clock signal 106 and the reference clock. In contrast to the control circuit of FIG. 2, the control circuit 100 generally can achieve frequency lock and phase lock in the steady state between the clock signal 106 and the reference clock quickly enough that the digital load avoids saturation.

FIG. 4 is a block diagram of a method 400 that can be performed by the control circuit 100.

At block 402, the method 400 includes providing, to the digital load 104, the supply voltage 108 and the clock signal 106 having the oscillation period that (i) depends on the supply voltage 108 and (ii) is greater than the critical path delay of the digital load 104.

At block 404, the method 400 includes adjusting the supply voltage 108 based on (i) the degree of the voltage difference between the supply voltage 108 and the reference voltage 112 and (ii) the degree of the phase difference between the clock signal 106 and the reference clock 114 such that the oscillation period is changed to reduce the degree of the phase difference between the clock signal 106 and the reference clock 114.

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

What is claimed is:

1. A control circuit comprising:
an oscillator configured to provide, to a digital load, a clock signal having an oscillation period that (i) depends on a supply voltage and (ii) is greater than a critical path delay of the digital load; and
a control module configured to:
provide the supply voltage to the digital load and the oscillator; and
adjust the supply voltage based on (i) a degree of a voltage difference between the supply voltage and a reference voltage and (ii) a degree of a phase difference between the clock signal and a reference clock such that the oscillator changes the oscillation period to reduce the degree of the phase difference between the clock signal and the reference clock.

2. The control circuit of claim 1, wherein the control module is further configured to generate a voltage offset signal that indicates the degree of the voltage difference between the supply voltage and the reference voltage.

3. The control circuit of claim 1, wherein the control module is further configured to generate a voltage offset signal that indicates the degree of the phase difference between the clock signal and the reference clock.

4. The control circuit of claim 3, wherein the control module further comprises a phase comparator configured to generate the voltage offset signal.

5. The control circuit of claim 1, wherein the control module is further configured to:
generate a first voltage offset signal that indicates the degree of the voltage difference between the supply voltage and the reference voltage; and
generate a second voltage offset signal that indicates the degree of the phase difference between the clock signal and the reference clock.

6. The control circuit of claim 5, wherein the control module is further configured to generate a sum of the first voltage offset signal and the second voltage offset signal, and wherein the control module is further configured to adjust the supply voltage based on the sum.

7. The control circuit of claim 1, wherein the digital load comprises a microprocessor or a graphics processing unit.

8. The control circuit of claim 1, wherein the control module is configured to increase the supply voltage such that the oscillation period of the clock signal decreases so that a lag time of the clock signal with respect to the reference clock is reduced.

9. The control circuit of claim 1, wherein the control module is configured to increase the supply voltage such that the oscillation period of the clock signal decreases so that a lag time of the clock signal with respect to the reference clock is reduced to substantially zero.

10. The control circuit of claim 1, wherein the control module is configured to decrease the supply voltage such that the oscillation period of the clock signal increases so that a lead time of the clock signal with respect to the reference clock is reduced.

11. The control circuit of claim 1, wherein the control module is configured to decrease the supply voltage such that the oscillation period of the clock signal increases so that a lead time of the clock signal with respect to the reference clock is reduced to substantially zero.

12. A method comprising:
providing, to a digital load, a supply voltage and a clock signal having an oscillation period that (i) depends on the supply voltage and (ii) is greater than a critical path delay of the digital load; and
adjusting the supply voltage based on (i) a degree of a voltage difference between the supply voltage and a reference voltage and (ii) a degree of a phase difference between the clock signal and a reference clock such that the oscillation period is changed to reduce the degree of the phase difference between the clock signal and the reference clock.

13. The method of claim 12, further comprising generating a voltage offset signal that indicates the degree of the voltage difference between the supply voltage and the reference voltage.

14. The method of claim 12, further comprising generating a voltage offset signal that indicates the degree of the phase difference between the clock signal and the reference clock.

15. The method of claim 12, further comprising:
generating a first voltage offset signal that indicates the degree of the voltage difference between the supply voltage and the reference voltage; and
generating a second voltage offset signal that indicates the degree of the phase difference between the clock signal and the reference clock.

16. The method of claim 15, further comprising generating a sum of the first voltage offset signal and the second voltage offset signal, wherein adjusting the supply voltage comprises adjusting the supply voltage based on the sum.

17. The method of claim 12, further comprising increasing the supply voltage such that the oscillation period of the clock signal decreases so that a lag time of the clock signal with respect to the reference clock is reduced.

18. The method of claim 12, further comprising increasing the supply voltage such that the oscillation period of the clock signal decreases so that a lag time of the clock signal with respect to the reference clock is reduced to substantially zero.

19. The method of claim 12, further comprising decreasing the supply voltage such that the oscillation period of the clock signal increases so that a lead time of the clock signal with respect to the reference clock is reduced.

20. The method of claim 12, further comprising decreasing the supply voltage such that the oscillation period of the clock signal increases so that a lead time of the clock signal with respect to the reference clock is reduced to substantially zero.

* * * * *